United States Patent
Miao et al.

(10) Patent No.: US 8,294,132 B2
(45) Date of Patent: Oct. 23, 2012

(54) GRAPHENE MEMRISTOR HAVING MODULATED GRAPHENE INTERLAYER CONDUCTION

(75) Inventors: Feng Miao, Mountain View, CA (US); Joshua Yang, Palo Alto, CA (US); Wei Wu, Palo Alto, CA (US); Shih-Yuan Wang, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 215 days.

(21) Appl. No.: 12/750,351

(22) Filed: Mar. 30, 2010

(65) Prior Publication Data
US 2011/0240946 A1    Oct. 6, 2011

(51) Int. Cl.
*H01L 29/04* (2006.01)
*H01L 47/00* (2006.01)
*H01L 29/02* (2006.01)

(52) U.S. Cl. .................... 257/3; 257/1; 257/2

(58) Field of Classification Search ............ 257/1–5, 257/421–427; 438/3
See application file for complete search history.

(56) References Cited

U.S. PATENT DOCUMENTS

| | | | |
|---|---|---|---|
| 7,319,235 B2 | 1/2008 | Happ | |
| 7,961,494 B2* | 6/2011 | Scheuerlein | 365/148 |
| 7,983,065 B2* | 7/2011 | Samachisa | 365/51 |
| 2003/0044608 A1* | 3/2003 | Yoshizawa et al. | 428/398 |
| 2003/0173612 A1* | 9/2003 | Krieger et al. | 257/304 |
| 2006/0049390 A1 | 3/2006 | Ufert et al. | |
| 2007/0114679 A1 | 5/2007 | Kordus, II et al. | |
| 2008/0079029 A1* | 4/2008 | Williams | 257/213 |
| 2008/0090337 A1 | 4/2008 | Williams | |
| 2008/0099752 A1 | 5/2008 | Kreupl et al. | |
| 2009/0283735 A1 | 11/2009 | Li et al. | |
| 2010/0006811 A1 | 1/2010 | Xu et al. | |
| 2010/0006812 A1 | 1/2010 | Xu et al. | |
| 2010/0279426 A1* | 11/2010 | Tour et al. | 436/149 |
| 2011/0176353 A1* | 7/2011 | Li et al. | 365/148 |

OTHER PUBLICATIONS

Kyaw Sint, et al. "Selective Ion Passage through Functionalized Graphene Nanopores" Jun. 10, 2008. J. Am. Chem. Soc. 2008, 130. pp. 16448-16449, United States.

O. Leenaerts, et al. "Graphene: A perfect nanoballoon" Sep. 11, 2008. Applied Physics Letters 93. pp. 193107-1-193107-3, Belgium.

Michael D. Fischbein, et al. "Electron beam nanosculpting of suspended graphene sheets" Aug. 5, 2008. Applied Physics Letters 93. pp. 113107-1-113107-3, United States.

T.J. Echtermeyer, et al. "Non-volatile switching in graphene field effect devices" Advanced Microelectronic Center Aachen (AMICA). pp. 1-14, Germany Aug. 2008.

Victor Ryzhii, et al. "Graphene Tunneling Transit-Time Terahertz Oscillator Based on Electrically Induced p-i-n Junction" Feb. 4, 2009. Applied Physics Express. Japan.

* cited by examiner

*Primary Examiner* — Fernando L Toledo
*Assistant Examiner* — Karen Kusumakar (57) ABSTRACT

A graphene memristor includes a first electrode, a second electrode electrically coupled to the first electrode, an active region interspersed between the first and second electrodes, a defective graphene structure that modulates a barrier height to migration of ions through the active region, fast diffusing ions that migrate under the influence an electric field to change a state of the graphene memristor, and a source that generates the electric field.

17 Claims, 8 Drawing Sheets

GRAPHENE MEMRISTOR HAVING MODULATED GRAPHENE INTERLAYER CONDUCTION

STATEMENT OF GOVERNMENT INTEREST

This inventions disclosed herein have been made with U.S. Government support under Contract Number 2008-0911510-002. The U.S. Government has certain rights in these inventions.

BACKGROUND

Memristive devices (or simply memristors) are a class of electrical components that potentially can be used for a variety of functions including as switches in electronic circuits and as non-volatile memory. Memristors include two-terminal devices in which the magnetic flux between the terminals is a function of electric charge passed through the device.

Memristors may be molecular- or nano-scale devices. When used in electronic circuits and non-volatile memory, such a nano-scale memristor may incorporate a single-atom thick layer of graphite, normally referred to as graphene. Under certain conditions, the graphene layer may form a barrier to the movement of ions between the terminals. To make this memristor operate as a switch or as non-volatile memory, some mechanism may allow the transport of ions through the graphene layer.

DESCRIPTION OF THE DRAWINGS

The Detailed Description will refer to the following drawings in which like numerals refer to like items, and in which.

DETAILED DESCRIPTION

In general terms, a memristor is a circuit element that maintains a functional relationship, called memristance, between time integrals of current and voltage. A specific implementation of memristor technology involves a switching memristor that employs a thin film of titanium dioxide, and has a regime of operation with an approximately linear charge-resistance relationship. Such a switching device has application in nano-electronic memories: devices that are so small that inter-atomic interactions and quantum mechanical properties apply. The same switching devices also may find application in computer logic and neuromorphinic computer architectures (e.g., very large scale integration (VLSI) systems containing electronic analog circuits that mimic neurobiological architectures present in the nervous system) and analog, digital or mixed-mode analog/digital VLSI systems that implement models of neural systems (for perception, motor control, or sensory processing) as well as software algorithms.

A memristor may be a two-terminal device in which magnetic flux $\phi_m$ between the terminals is a function of the amount of electric charge q that has passed through the device. Alternately, a memristor may be embodied as a three-terminal device. A memristor may be characterized by its memristance function, which describes the charge-dependent rate of change of flux with charge:

$$M(q) = \frac{d\Phi_m}{dq}$$

Since magnetic flux is the time integral of voltage, and charge is the time integral of current, the memristance function may be written as:

$$M(q(t)) = \frac{\frac{d\Phi_m}{dt}}{\frac{dq}{dt}} = \frac{V(t)}{I(t)}$$

Thus, memristance may be considered charge-dependent resistance. If the memristance function is a constant, then by Ohm's law, $R(t)=V(t)/I(t)$. If the memristance function is not constant, or nearly so, however, the equations are not equivalent because $q(t)$ and $M(q(t))$ will vary with time.

The memristance function thus defines a linear relationship between current and voltage, as long as charge does not vary. Of course, nonzero current implies time varying charge. Alternating current, however, may show the linear dependence in circuit operation by inducing a measurable voltage without net charge movement as long as the maximum change in q does not cause much change in M.

Furthermore, the memristor is static if no current is applied. If $I(t)=0$, then $V(t)=0$ and $M(t)$ is constant. This is the essence of the memory effect of a memristor. The memristor's power consumption characteristic follows that, $I^2R$, of a resistor. Thus:

$$P(t)=i(t)V(t)=I^2(t)M(q(t))$$

As long as $M(q(t))$ varies little, such as under alternating current conditions, the memristor will appear as a resistor. If $M(q(t))$ increases rapidly, however, current and power consumption will quickly stop.

For some memristors, applied current or voltage will cause a large change in resistance. Such memristors may be characterized as switches considering the time and energy needed to achieve a desired change in resistance. For a memristor to switch from the resistance ON state ($R_{on}$) to the resistance OFF state ($R_{off}$) in time $T_{on}$ to $T_{off}$, the charge must change by $\Delta Q=Q_{on}-Q_{off}$. Assuming that the applied voltage remains constant, the energy required for switching is the integral of $dt/M(q(t))$ over the time interval $T_{on}$ to $T_{off}$.

This switching power characteristic differs fundamentally from that of a metal oxide semiconductor transistor, which is a capacitor-based device. Unlike the transistor, the final state of the memristor in terms of charge does not depend on bias voltage.

Memristance is displayed when enough charge has passed through the memristor that the ions can no longer move, and the memristor enters hysteresis. Mathematically, this condition is defined by keeping q at an upper bound and M fixed. The memristor then acts as a resistor until current is reversed.

A memristor may be implemented as a nano-scale device, based on the behavior of nano-scale thin films. In an embodiment, a solid-state memristor is combined into devices called crossbar latches, which could replace transistors in computers, taking up a much smaller area because the memristor devices that make up a crossbar latch potentially can be made far smaller than any transistor. Thus crossbar latches allow much the same functionality as transistors, except on a molecular scale. The crossbar latch consists of a signal line crossed by two control lines. Depending on the voltages sent down the various lines, crossbar latches can simulate the action of the three major logic gates: AND, OR, and NOT.

Nano-scale memristors also can be fashioned into non-volatile solid-state memory, which would allow greater data density than hard drives but with access times potentially similar to DRAM, thereby being capable of replacing both components.

Figure 1:
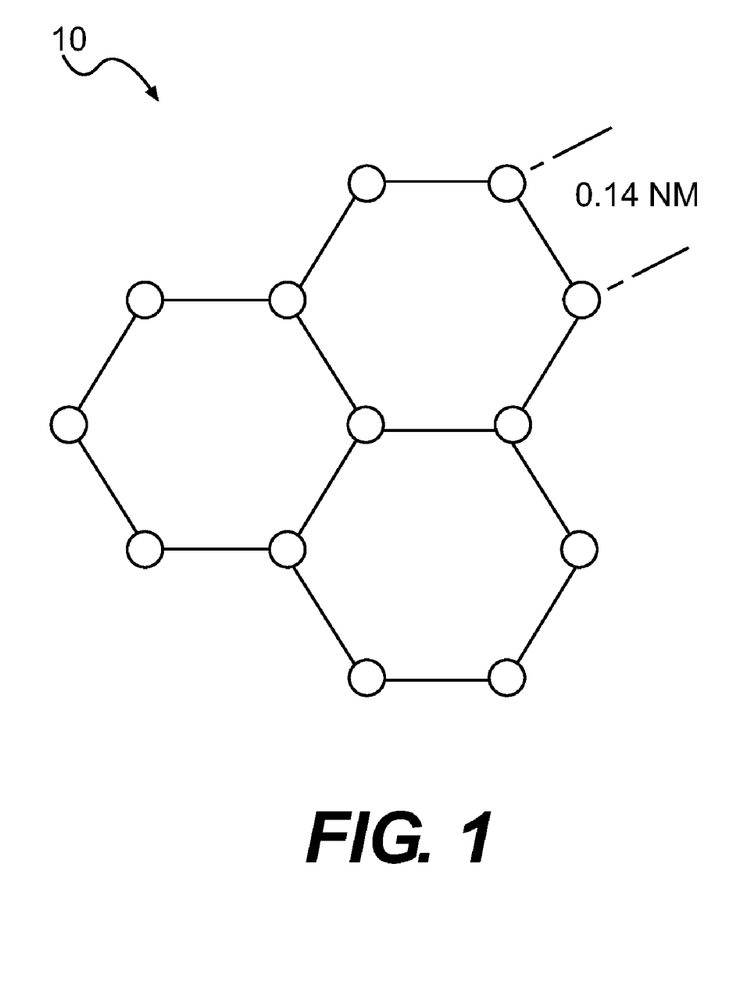
FIG. 1 illustrates a single graphene layer.

FIG. 1 illustrates a single graphene layer that may be used in nano-scale memristors. In FIG. 1, graphene layer 10 can be seen to consist of a single atom-thick layer of carbon atoms, with each carbon atom linked in a hexagonal relationship with adjoining carbon atoms. Such a graphene layer 10 may be referred to as a two-dimensional carbon crystal. The graphene layer 10 has a number of physical and electrical properties that make it an excellent material when used in a nano-scale device, such as a nano-scale switch or memory element. When no voltage is applied across it, the graphene layer 10 acts as a near perfect filter. However, in the presence of applied voltage, ions may migrate across the graphene layer 10. Because the graphene layer 10 is very thin, in the nano-scale range, the time for ions to diffuse across the graphene layer 10 is small, in the range of nanoseconds.

Although FIG. 1 illustrates a graphene layer (i.e., a single carbon-atom thick structure), in some embodiments of a nano-scale memristor, a structure having more than one graphene layer may be used. A structure having more than one graphene layers may be referred to as graphite, where the layers are separated by a gap. As will be described later, the gap is the normal 0.335 nm gap that exists between layers in graphite. Alternately, a structure having more than one graphene layer may include two (or more) graphene layers separated by another material, such as a dielectric material. As used hereinafter, a "graphene structure" refers to one or more graphene layers, separated by a gap or by another material, while a "graphene layer" has its ordinary meaning of a single carbon-atom layer.

Because of its filtering effect, a perfect graphene layer presents a very high barrier to the mobility of ions. To overcome this barrier, an electronic device comprising a graphene layer would ordinarily require a large power application to entice ion drift of even small, fast diffusing ions, such as $H^+$, across the graphene layer. As used herein, small, fast diffusing ions (or simply fast diffusing ions—being very small, the ions can diffuse very fast) include, in addition to $H^+$, $Li^+$ (radius 0.068 nm), $Na^+$ (radius 0.095 nm), and $K^+$ (radius 0.133 nm), for example. In the discussion that follows, the use of fast diffusing ions will refer to $K^+$, although any of the aforementioned fast diffusing ions may be used. When a graphene layer has certain defects, the ion mobility barrier height can be reduced significantly, and the consequent power requirements correspondingly reduced. In fact, the barrier energy for migration of these ions through the graphene layer can be tuned from over 10 eV to sub 1 eV by engineering defects in the graphene layer. Furthermore, the size or shape of these engineered defects affects the barrier energy of the memristor. Thus, a defective graphene layer can serve as an ideal filter, gating the drift of ions inside the memristors in which they are incorporated. Under a relatively high electric field for switching, the defective graphene layer with certain barrier height allows the $K^+$ ions to pass through and change the resistance of the junction. Under lower energy for reading, the barrier height of graphene stops the drift and diffusion of the $K^+$ ions, keeping the $K^+$ ions on one side of the graphene layer and remembering the resistance state of the junction.

Defects can be naturally occurring or may be engineered into the graphene structure. In the realm of semi-conductors, in an embodiment, any defects in the graphene structure would be engineered by, for example, displacing one or more carbon atoms and/or adding an impurity to the graphene layer.

Figure 2A:
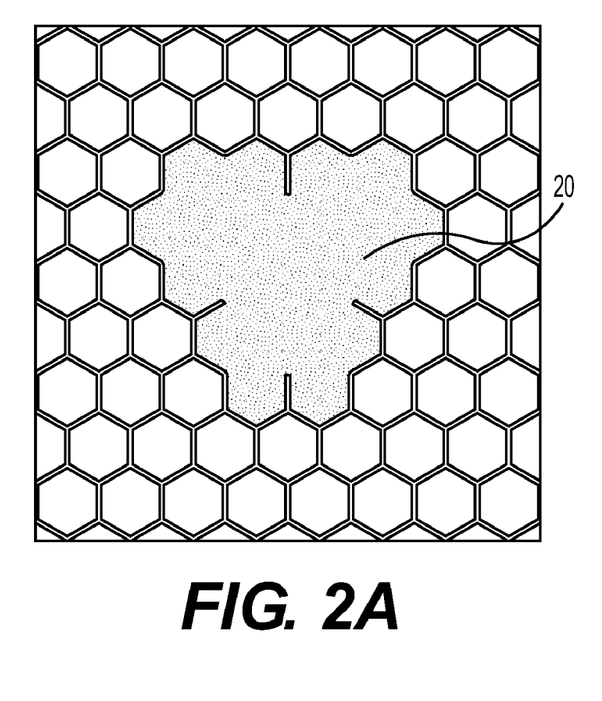
FIGS. 2A and 2B illustrate engineered defects in a graphene layer.
Figure 2B:
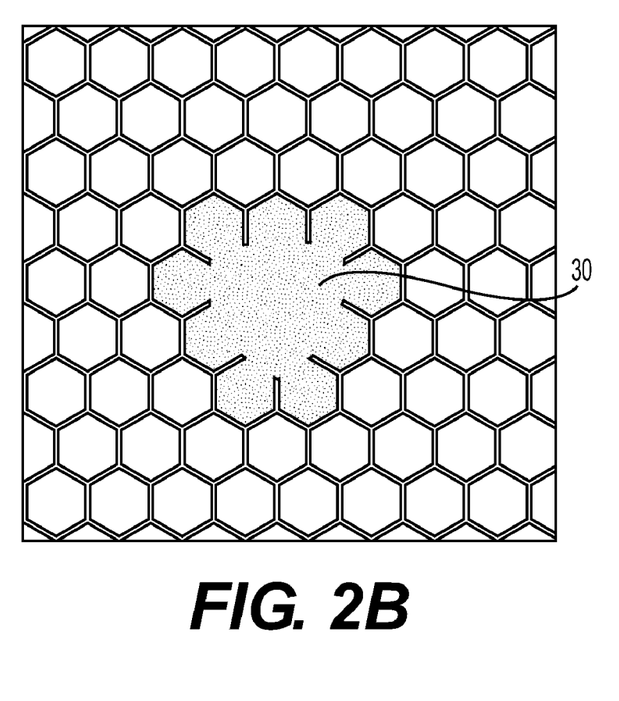

The above mentioned engineered defects produce nanopores through which the $K^+$ ions can migrate, in the presence of an electric field. The graphene layer 10 may have nanopores engineered into it by ion etching followed by local oxidation of the nanopore edges. FIGS. 2A and 2B illustrate nanopores in a graphene layer. In FIG. 2A, a graphene layer is shown with nanopore 20, which is formed by ion etching and local oxidation using negatively charged nitrogen and fluorine. The thus-formed nanopore 20 favors passage of cations. In FIG. 2B, a graphene layer includes nanopore 30, which is formed by ion etching followed by local oxidation using positively charged hydrogen ions. Nanopore 30 favors passage of anions.

Figure 3A:
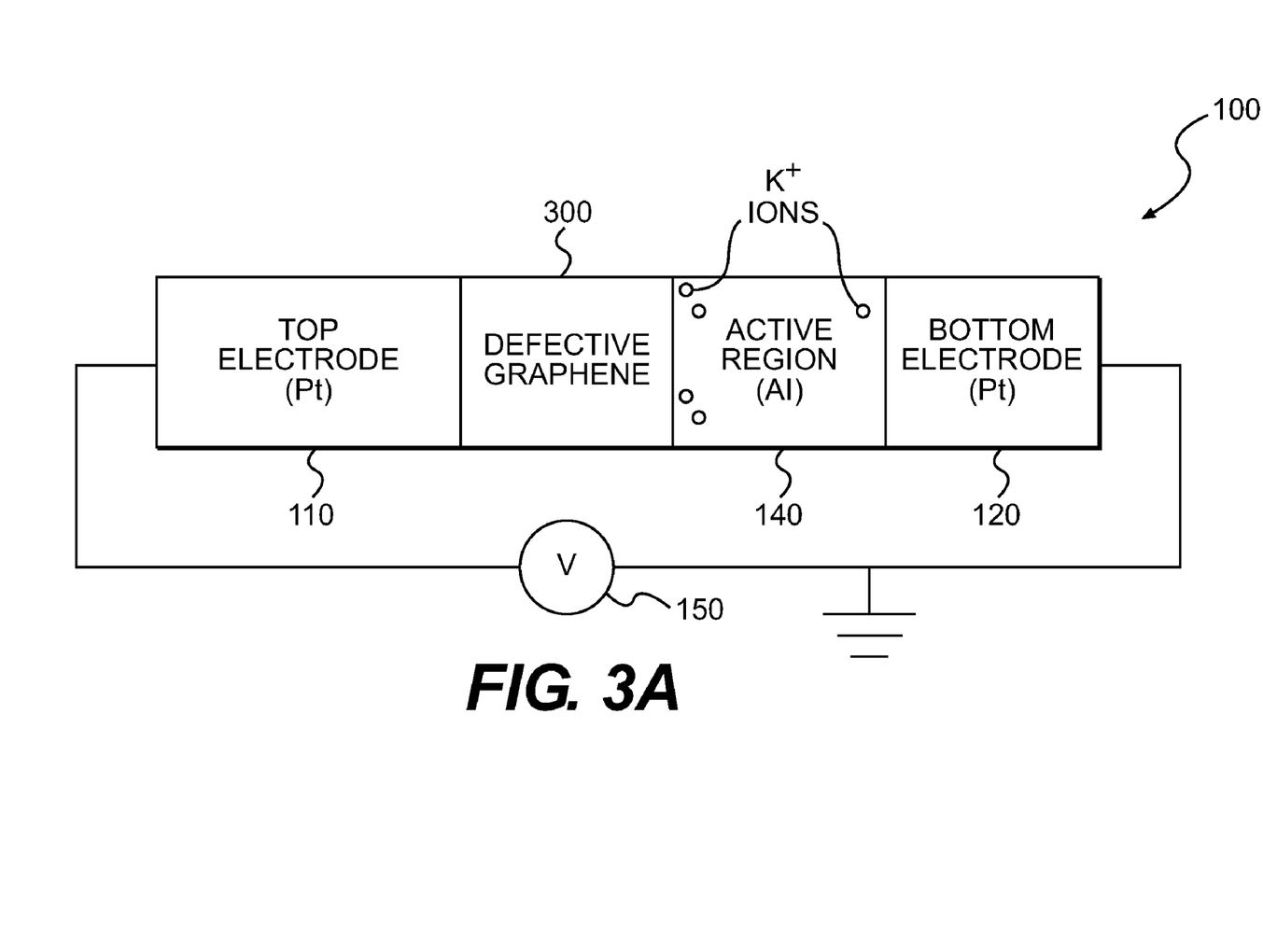
FIGS. 3A-3D illustrate embodiments of a nano-scale memristor that uses an exemplary graphene structure.

FIGS. 3A-3D illustrate embodiments of a two-terminal, nano-scale memristor employing an exemplary (i.e., defective) graphene layer that allows for modulating conductance of the entire stack by driving $K^+$ ions across the graphene layer. In FIG. 3A, memristor 100 is shown in an ON state. Memristor 100 comprises a top (or first) electrode 110 and a bottom (or second) electrode 120. Voltage source 150 connects to each of the top electrode 110 and the bottom electrode 120 and ground to provide an electric field in the memristor 100. Both electrodes 110, 120 may be platinum. Alternatively, both electrodes 110 and 120 may be tungsten or both may be titanium. Other suitable materials may be used for the electrodes 110 and 120. The electrodes 110, 120 may be on the order of 5 nm thick, or thicker. Interspersed between the electrodes 110 and 120 is defective graphene layer 300, and an active region 140. The active region 140 may be formed from a metal that has a poor contact with graphene, such as aluminum, for example. Finally, the memristor 100 includes $K^+$ ions, which may be introduced through ion implantation, or thermal diffusion, for example.

Because of the small size of the memristor 100, the amount of power required to cause switching between an ON state and an OFF state is on the order of one picojoule; i.e., $\Delta Q=Q_{on}-Q_{off}=1$ picojoule. Thus, when a sufficiently strong electric field is created by application of a switching voltage V to the memristor 100, the $K^+$ ions diffuse through the defective graphene layer 300. For example, if the bottom electrode 120 is grounded and a negative voltage is applied to the top electrode 110, as shown in FIG. 3A, $K^+$ ions will diffuse from the Al active region 140, across the defective graphene layer 300 and the memristor 100 will be in the OFF state. Because of its "memory" capacity, the memristor 100 will remain in the OFF state for a substantial time (e.g., years) or until a sufficiently high positive voltage is applied to the top electrode 110. Such a positive voltage will "push" the $K^+$ ions to the active region 140, and the memristor 100 will be in (and remain in) an ON state.

Figure 3B:
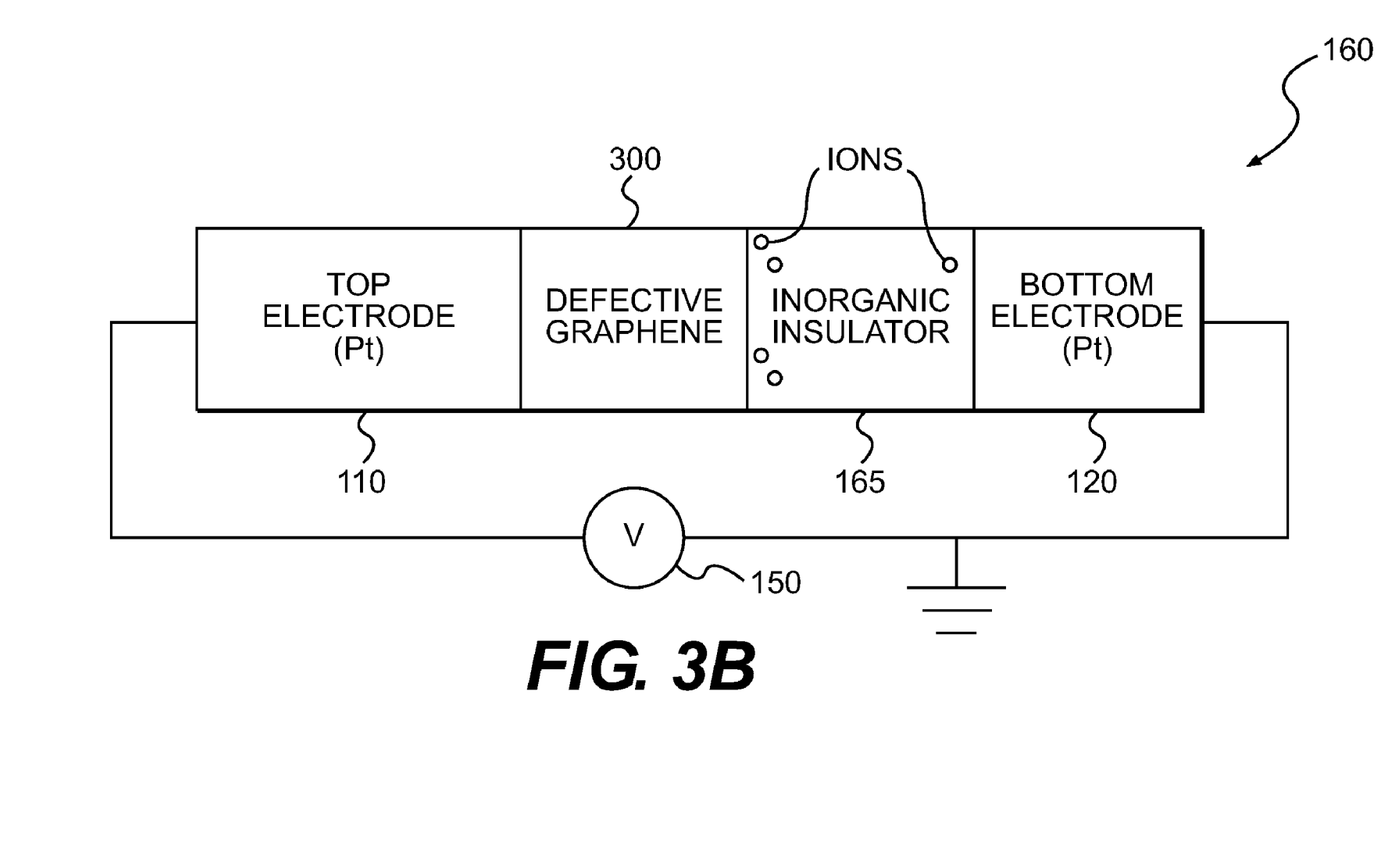

FIG. 3B illustrates an alternate embodiment of a two-terminal nano-scale memristor. In FIG. 3B, memristor 160 is shown in an ON state. The memristor 160 is similar in some respects to the memristor 100 of FIG. 3A. However, the memristor 160 uses an inorganic insulator 165 as an active region, which may be aluminum nitride (AlN) of titanium oxide ($TiO_2$), for example, interspersed between the bottom electrode 120 and the defective graphene layer 300, and which, without the presence of dopant ions, usually is resistive. Titanium dioxide may be used as the inorganic insulator 165 because of the barrier effect created by the presence of the defective graphene layer 300. That is, the ions that are driven by the electric field to change the "active region" resistance of inorganic insulator 165 are fast diffusing ions such as $K^+$, $Na^+$, Li+, and H+, for example. Ordinarily, these ions diffuse so easily that the resistance-based switching caused by their drift is volatile at room temperature. That is, without some barrier between the electrodes 110, 120, the memristor 160 could undergo uncontrolled switching at room temperature. However, in the memristor 160, the defective graphene layer 300 creates a barrier to this diffusion. The diffusion barrier height can be reduced from as much as 10 eV to less than 1 eV by engineering the defects (size, shape, nature, etc.) in the defective graphene layer 300. Therefore, even if $TiO_2$ is used as the "active region" of the memristor 160, the fast diffusing ions, rather than the normal oxygen vacancies, are used for switching the state of the memristor 160. Thus, by application of an appropriate switching voltage V between the top and bottom electrodes 110 and 120, the $K^+$ ions, which can be introduced by ion implantation, for example, can be made to migrate across the defective graphene layer 300 to the inorganic insulator 165, thereby switching the memristor 160 to the ON state. When the switching voltage V is removed, the memristor 160 remembers its state, and thus remains in the ON state.

Figure 3C:
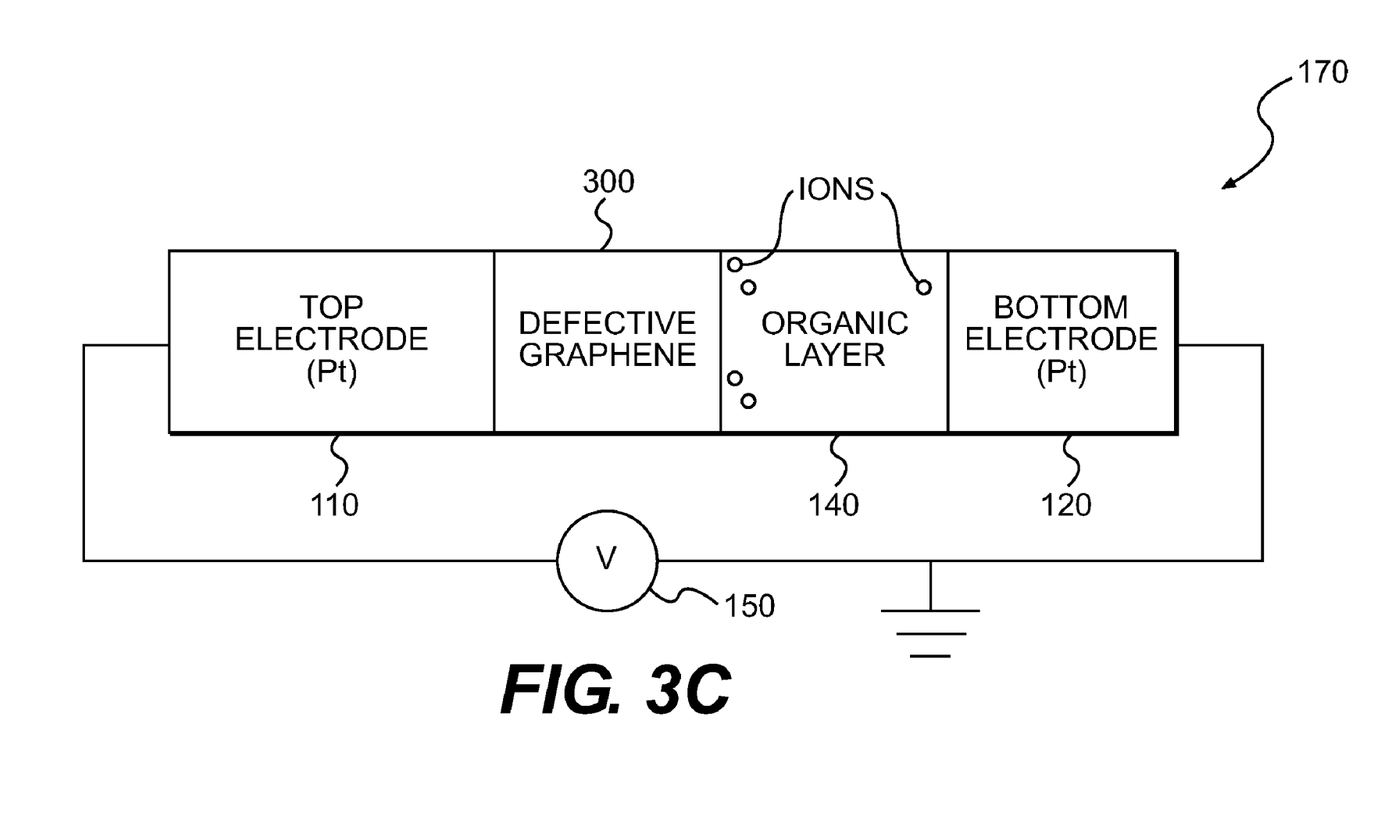

FIG. 3C illustrates another alternate embodiment of a two-terminal nano-scale memristor. In FIG. 3C, memristor 170 is shown in an ON state. The memristor 170 is similar in some respects to the memristor 100 of FIG. 3A. However, the memristor 170 uses as an active region, an organic insulator 175, which may be a polymer, for example, interspersed between the bottom electrode 120 and defective graphene layer 300. The polymer may be one of a crosslink polyethylene oxide (PEO), PMMA, PEDOT:PSS or Poly(3,4-ethylenedioxythiophene) poly(styrenesulfonate), for example. The organic insulator 175, without the presence of $K^+$ ions, normally is resistive. However, under the effect of voltage source 150, by driving the $K^+$ ions into the organic insulator 175, the organic insulator 175 becomes conductive.

Figure 3D:
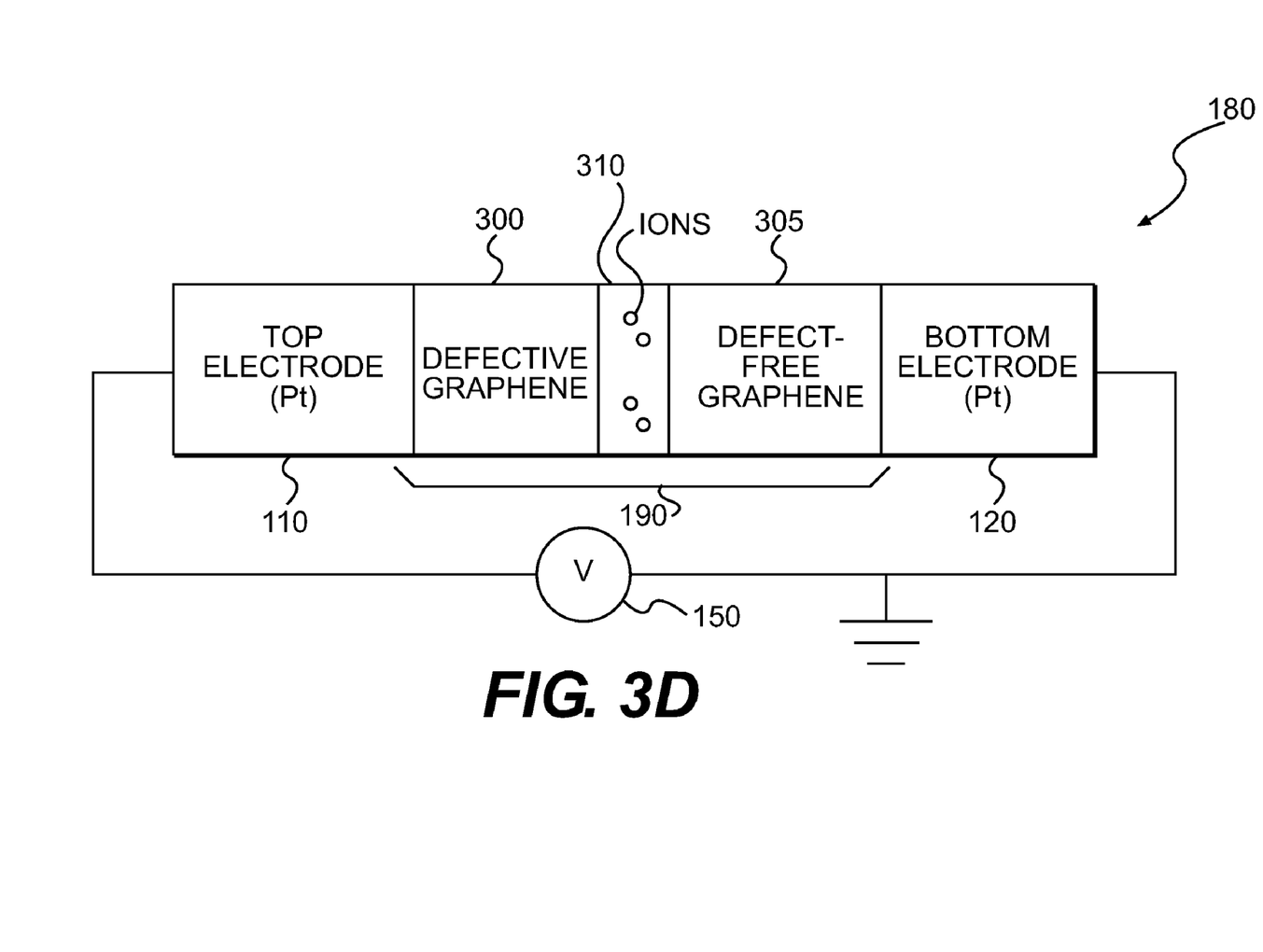

FIG. 3D illustrates yet another alternate embodiment of a nano-scale two-terminal memristor. In FIG. 3D, memristor 180 is shown in an ON state. The memristor 180 is similar in some respects to the memristor 100 of FIG. 3A. However, the memristor 180 uses an graphene structure 190 that includes defective graphene layer 300 and defect-free graphene layer 305, which together, define gap 310. The gap 310 is held by the pi bond of carbon atoms, which is about 0.335 nm; i.e., the layer distance of graphite. When the gap 310 is empty, a high resistance exists in the gap; when the gap is filled will K+ ions, a low resistance exists. The gap 310 acts, in essence, as an active region. The graphene structure 190 is interspersed between the top electrode 110 and the bottom electrode 120.

The gap 310 creates a barrier to the passage of electrons across the memristor 180. To overcome this barrier, $K^+$ ions are added to the memristor 180. The $K^+$ ions can then migrate through the defective graphene layer 300 under conditions of a sufficient switching voltage V, to place the memristor 180 in an ON state.

Thus, the two terminal memristors of FIGS. 3A-3D differ primarily in the choice of materials interspersed between the top and bottom electrodes 110 and 120. These materials include a metal (FIG. 3A), an inorganic insulator (FIG. 3B), an organic insulator (FIG. 3C) and nothing (i.e., a gap) (FIG. 3D).

Figure 4:
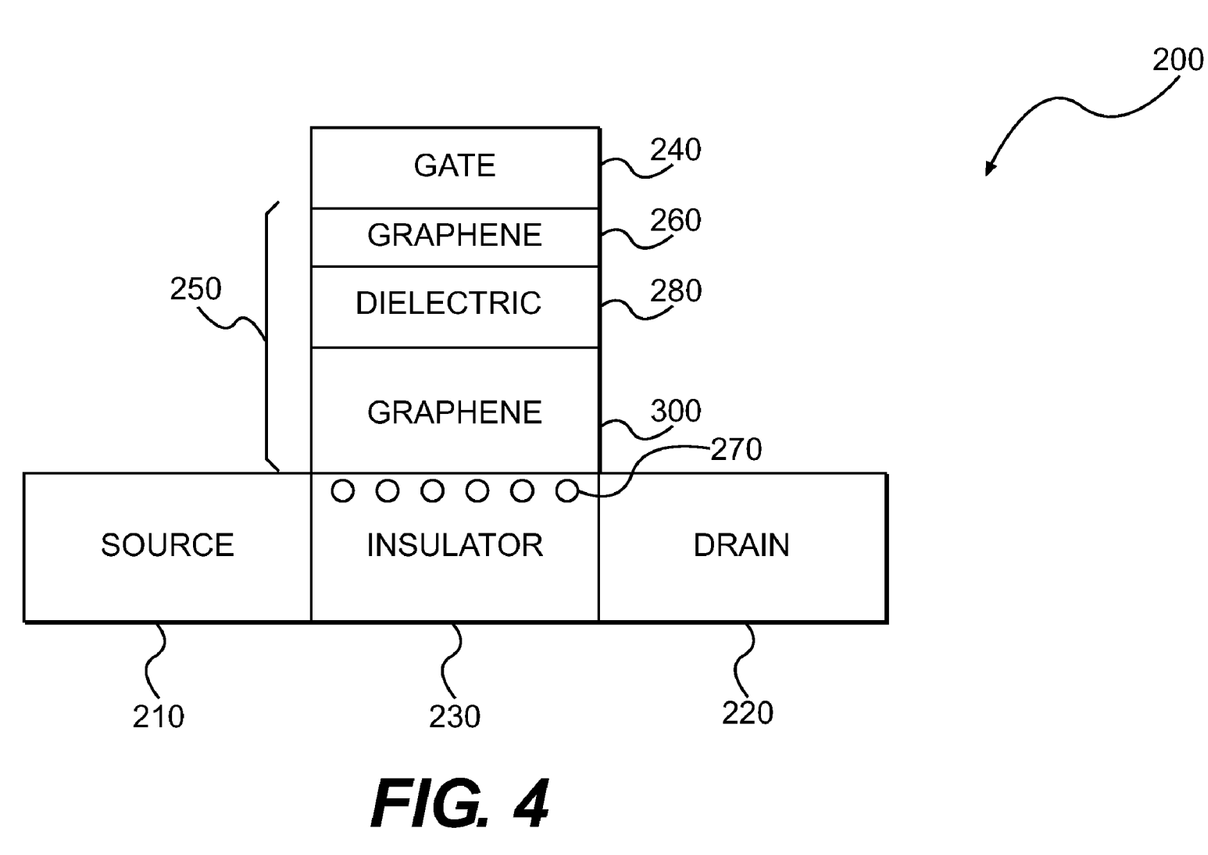
FIG. 4 illustrates another embodiment of a nano-scale memristor.

FIG. 4 illustrates still another embodiment of a nano-scale memristor; in this embodiment, a three-terminal memristor. In FIG. 4, memristor 200 includes source electrode 210, drain electrode 220, and insulator 230 separating the source and drain electrodes 210, 220. The memristor 200 also includes gate electrode 240, which is separated from the insulator 230 by graphene structure 250. The graphene structure 250 includes defective graphene layer 300 and defect-free graphene layer 260, thereby forming a bi-layer graphene structure. In an embodiment, the graphene structure 250 includes dielectric 280. Finally, the memristor 200 includes $K^+$ ions 270.

In an alternate embodiment of the nano-scale memristor 200 of FIG. 4, the graphene structure 250 is replaced by a structure similar to the graphene structure 190 of FIG. 3D. In this alternative embodiment, application of a potential by way of the gate electrode 240 drives the $K^+$ ions from the gap 310 into the active region 230.

Ideally, the memristors shown in FIGS. 3A-4 would demonstrate certain enhanced switching metrics. These metrics include switching speed, which refers to the time required to toggle between the ON and OFF states, endurance, which refers to the number of switching events a memristor can undergo before failure, and retention time, which refers to the time period during which the memristor maintains its current state (ON or OFF) in the absence of applied power. Such retention times may be on the order of years.

The memristors also scale well physically. Because of the one carbon-atom thick graphene layer, the memristors can be scaled down to a few angstroms thick and a few square nanometers in area.

Figure 5A:
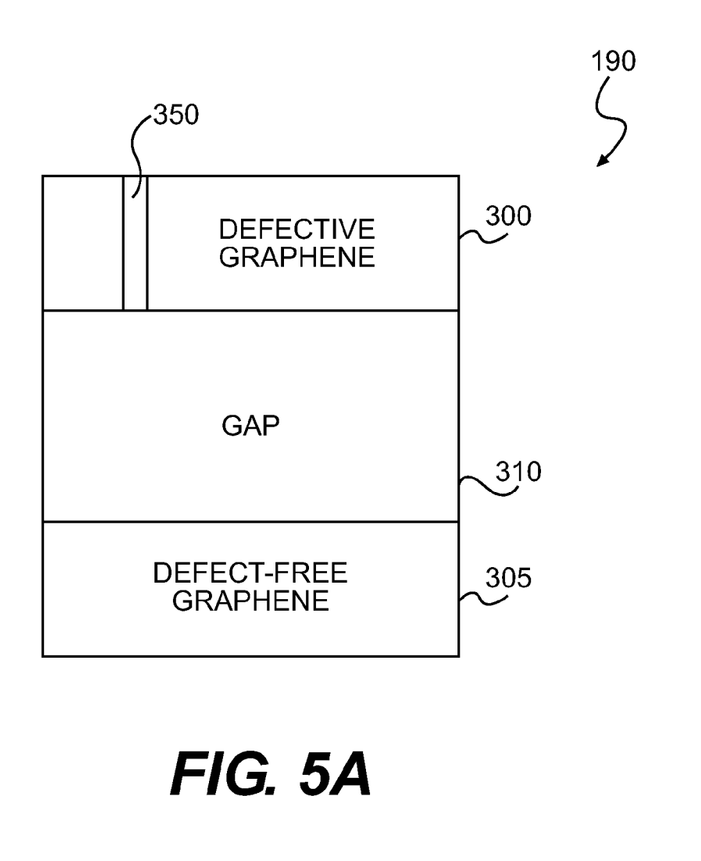
FIGS. 5A and 5B illustrate exemplary graphene structures in detail.

The graphene structure 190 of the memristor device of FIG. 3D is illustrated in more detail in FIG. 5A. Graphene structure 190 is a bi-layer structure that includes top graphene layer 300 and bottom graphene layer 305, which together define gap 310. The top graphene layer 300 is a defective graphene layer containing one or more engineered defects 350, and the bottom graphene layer 305 is a defect-free graphene layer. The gap 310 is held by the pi bond of carbon atoms, which is about 0.335 nm; i.e., the layer distance of graphite. When the gap 310 is empty, a high resistance exists in the gap; when the gap is filled will $K^+$ ions, a low resistance exists.

Figure 5B:
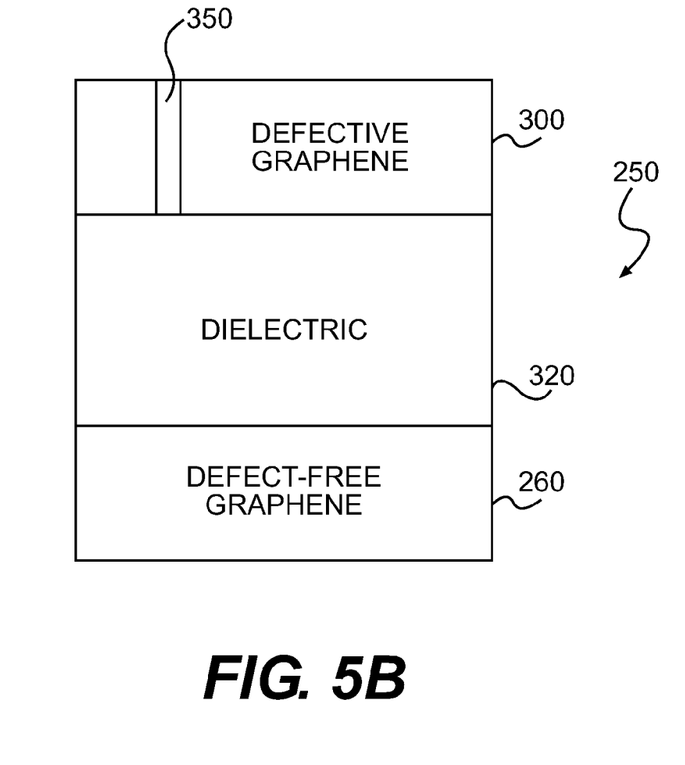

FIG. 5B is a detailed illustration of the graphene structure 250 of FIG. 4. The graphene structure 250 is similar to the graphene structure 190 except that the graphene structure 250 includes dielectric layer 320 interspersed between defective graphene layer 300 and defect-free graphene layer 260. The dielectric layer 320 may be any suitable insulating or semiconductor dielectric material including silicon ($SiO_2$) and germanium (Ge). The graphene structure 250 allows for ion drift through the defective graphene layer 300 when a sufficient electric field is applied. Since electrons need to transport through the electronic barrier between the two graphene layers, graphene interlayer conductance can be modulated by manipulating ion-conducting channels between the two graphene layers 300, 260 under the effects of an electric field. The graphene structure 250 has a high conductance (ON) state with ion-conducting channels bridging the two layers 300, 260 and a low conductance (OFF) state with a tunnel gap between the two layers 300, 260.

By using this bi-layer graphene structure, the tunneling distance through the graphene layers is known. When necessary or desired to increase the OFF-state resistance of the graphene structure 250, the thickness of the dielectric layer 320 can be increased. In an embodiment, the addition of the dielectric material 320 increases the tunneling distance to about 5 nm.

In either FIG. 5A or 5B, the defective graphene layer 300 may include one or more engineered defects 350 that are intended to enhance the mobility of K⁺ ions. Such defects may be formed by removing one or more carbon atoms, or by introducing an impurity atom into graphene layer (see FIGS. 2A and 2B). The resulting defects, or nanopores, allow ions to migrate more easily under the effect of an applied potential (by way of gate electrode 240 (FIG. 4) or voltage source 150 (FIGS. 3A-3D)).

The graphene structures 190 and 250 provide for a dimensionally-scalable memristor that may be only a few Angstroms to a few nanometers thick and a few square nanometers in cross-section. The memristor is formed as a low power device by engineering the selectivity and barrier height of the defects such as nanopores, to control the power to be very low—to the extent of moving only a single or a few ions. The memristor has good switching performance, meaning good switching speed, endurance and retention time.

In FIGS. 5A and 5B, by selectively forming engineered defects in the defective graphene layer 300, and additionally by using dielectric layer 320 (FIG. 5B) interspersed between the top and bottom graphene layers, the performance metrics of switching speed, endurance, and retention time can be altered to suit the designer's desires. This modulation of the graphene interlayer conduction allows production of a graphene memristor having a number of notable advancements over modern day transistors, and makes the thus-formed graphene memristor suitable for a wide range of applications, including as a replacement for computer memory, and as a switching element in computer architecture. For example, by careful selection and formation of engineered defects and use of a specific dielectric material, a graphene memristor may be formed that will remember its state (i.e., ON or OFF) for years without the application of power to the graphene memristor. For the nano-scale graphene memristor embodiments shown in FIGS. 3A-3D, a similar modulation of the interlayer conduction can be achieved by selectively forming engineered defects in the defective graphene layer 300.

We claim:

1. A graphene memristor, comprising:
  a first electrode;
  a second electrode electrically coupled to the first electrode;
  an active region interspersed between the first and second electrodes;
  a defective graphene structure that modulates a barrier height to migration of ions through the active region, comprising:
    a defective graphene layer comprising one or more fixed, physical defects, and
    a defect-free graphene layer;
  fast diffusing ions that migrate under the influence an electric field to change a state of the graphene memristor; and
  a source that generates the electric field.

2. The graphene memristor of claim 1, wherein the one or more fixed physical defects comprise one or more engineered defects.

3. The graphene memristor of claim 2, wherein the engineered defects comprise one or more of interstitial atoms and removed carbon atoms.

4. The graphene memristor of claim 2, wherein the engineered defects comprise defects having different areas.

5. The graphene memristor of claim 2, wherein the engineered defects have substantially a same area.

6. The graphene memristor of claim 1, wherein the defective graphene layer and the defect-free graphene layer define a gap corresponding to a distance between two layers of graphite, and wherein the gap comprises the active region.

7. The graphene memristor of claim 1, wherein the source that generates the electric field comprises a gate electrode.

8. The graphene memristor of claim 7, wherein the defective graphene structure is interposed between the gate electrode and the active region, whereby a bi-layer defective graphene structure is formed.

9. The graphene memristor of claim 8, wherein the hi-layer defective graphene structure further comprises a dielectric layer interposed between the defective graphene layer and the defect-free graphene layer, and wherein the generated electric field causes the fast diffusing ions to migrate from the dielectric layer to the active region.

10. A graphene memristor, comprising:
  a first electrode;
  a second electrode;
  an active region interposed between the first and second electrodes;
  a voltage source coupling the first and second electrodes;
  a plurality of fast diffusing ions; and
  a graphene structure that modulates ion conductance in the active region, wherein the voltage source provides a potential for the ion conduction, and wherein the graphene structure comprises:
    a defect-free graphene layer comprising one or more fixed, physical defects, and
    a defective graphene layer.

11. The graphene memristor of claim 10, wherein the defective graphene layer is interspersed between the first electrode and the active region.

12. The graphene memristor of claim 10, wherein the first electrode is a source electrode and the second electrode is a drain electrode, wherein the voltage source is a gate electrode, and wherein the defect-free graphene layer is adjacent the gate electrode.

13. The graphene memristor of claim 12, wherein the graphene structure further comprises a dielectric layer disposed between the defect-free graphene layer and the defective graphene layer.

14. The graphene memristor of claim 12, wherein the defective graphene layer comprises engineered defects.

15. The graphene memristor of claim 10, wherein the active region comprises one of an organic insulator, and inorganic insulator, and a poor contact metal.

16. The graphene memristor of claim 10, wherein the graphene structure comprises the defect-free graphene layer adjacent the second electrode the defective graphene layer adjacent the first electrode, and wherein the defect-free graphene layer and the defective graphene layer define a gap comprising the active region.

17. A nano-scale graphene memristor, comprising:
  a first electrode;
  a second electrode; and
  means for switching the memristor from an OFF state to an ON state, wherein the nano-scale graphene memristor remains in a most recent one of the OFF state and the ON state when the potential is removed from the graphene memristor, and wherein the means for switching comprises:
    means for applying a potential to the first and the second electrodes,
    an active region disposed between the first and second electrodes, the active region comprising a plurality of fast diffusing ions, and
    means for gating the fast diffusing ions.

* * * * *

UNITED STATES PATENT AND TRADEMARK OFFICE
CERTIFICATE OF CORRECTION

PATENT NO.        : 8,294,132 B2
APPLICATION NO.   : 12/750351
DATED             : October 23, 2012
INVENTOR(S)       : Feng Miao et al.

It is certified that error appears in the above-identified patent and that said Letters Patent is hereby corrected as shown below:

In the Claims:

In column 7, line 49, in Claim 1, after "influence" insert -- of --.

In column 8, line 8, in Claim 9, delete "hi-layer" and insert -- bi-layer --, therefor.

In column 8, line 45, in Claim 16, delete "electrode" and insert -- electrode, --, therefor.

Signed and Sealed this
Fourteenth Day of May, 2013

Teresa Stanek Rea
*Acting Director of the United States Patent and Trademark Office*